United States Patent [19]
Davis et al.

[11] Patent Number: 5,200,733
[45] Date of Patent: Apr. 6, 1993

[54] RESISTOR STRUCTURE AND METHOD OF FABRICATION

[75] Inventors: Christopher K. Davis, Merritt Island; Thomas L. Carndell, Palm Bay, both of Fla.

[73] Assignee: Harris Semiconductor Corporation, Melbourne, Fla.

[21] Appl. No.: 769,209

[22] Filed: Oct. 1, 1991

[51] Int. Cl.$^5$ .............................................. H01C 1/06
[52] U.S. Cl. ...................................... 338/64; 338/307
[58] Field of Search ................ 338/64, 306, 307, 308, 338/309; 357/51

[56] References Cited

U.S. PATENT DOCUMENTS

| | | | |
|---|---|---|---|
| 3,616,401 | 10/1971 | Cunningham et al. | 338/309 X |
| 4,609,903 | 9/1986 | Toyokura et al. | 338/306 X |
| 4,760,369 | 7/1988 | Tiku | 338/308 X |
| 4,785,279 | 11/1988 | Wetzel | 338/314 |

*Primary Examiner*—Marvin M. Lateef
*Attorney, Agent, or Firm*—Barnes & Thornburg

[57] ABSTRACT

A resistor in an integrated circuit having a conductive shield layer between the resistor and an insulative layer. The contacts of the resistor may also contact the conductive shield layer. The shield layer may be formed during a single or double level polysilicon bipolar transistor fabrication process.

14 Claims, 3 Drawing Sheets

RESISTOR STRUCTURE AND METHOD OF FABRICATION

BACKGROUND AND SUMMARY OF THE INVENTION

The present invention relates generally to integrated circuits having resistors and more specifically to electrical shielding of resistors in integrated circuits.

Presently, diffused or implanted resistors fabricated in semiconductor integrated circuits are formed in such a way that they are at least partially covered over their top surfaces with an insulating dielectric. In silicon-based technologies, this dielectric is often silicon dioxide, which may be either deposited or thermally grown, to isolate the resistors from other structures or to passivate the silicon surface itself. Disadvantages of overlaying the resistor with dielectric material are that the electrical condition at the resistor-dielectric interface is influenced by charges trapped in the dielectric; and that fields generated by conductor layers over the resistor-dielectric structure can have a dynamic effect on the resistor characteristics. Furthermore, interface traps associated with the dielectric are known to increase the level of electronic noise in the structure.

Thus it is an object of the present invention to provide an improved resistor and integrated circuit.

Another object of the present invention is to provide a method and structure for producing a shielded resistor and integrated circuit.

These and other advantages are achieved by providing a conductive shield layer on a resistor region between the resistor region and an insulative layer. Preferably the shield layer extends the length of the body of the resistor region. Contacts are made to the resistor region through openings in the insulator either spaced from or in contact with the shield layer. Preferably, the resistivity of the conductive shield layer is at least ten times greater than that of the resistive region. For a silicon resistor, the shield layer may be metal, metallic silicide or polycrystalline silicon. The resistor region and shield layer may be formed in parallel with formation of the intrinsic base and emitter polysilicon contact in a bipolar process.

Other objects, advantages and novel features of the present invention will become apparent from the following detailed description of the invention when considered in conjunction with the accompanying drawings.

DETAILED DESCRIPTION OF THE INVENTION

Figure 1:
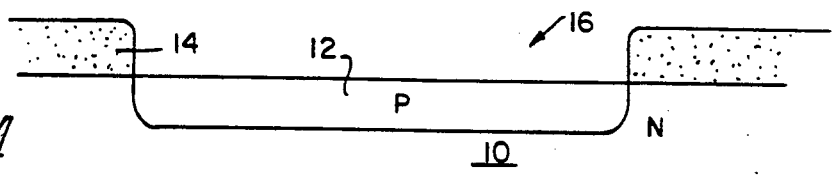
FIGS. 1-4 show, in cross-sectional view, a shielded resistor at various stages of fabrication according to the principles of the present invention.

As illustrated in FIG. 1, a semiconductor layer 10 of an integrated circuit has a resistive region 12 formed therein. For purposes of example only, the layer 10 will be considered N conductivity type silicon with a P conductivity type resistor formed therein. The region 12 may be formed by ion implantation. Accordingly, a first insulative layer 14 is formed on the surface of the layer 10 and an opening 16 is defined to expose the surface of the resistive region 12. The resistive region 12 is then formed through the opening 16 with a P type implant. Alternately, the dopant can be introduced by a deposition technique.

Figure 2:
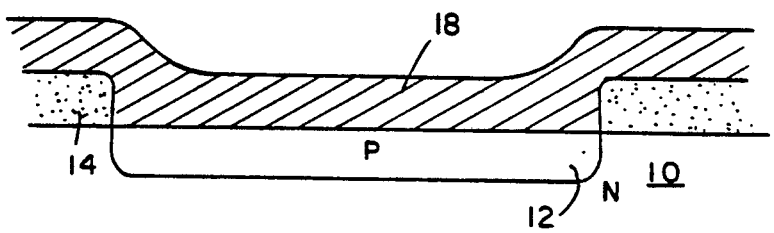

Next, a polysilicon conductive shield layer 18 is formed over the exposed region 12 and the layer 14. See FIG. 2. Alternately, the layer 18 could be a metallic silicide. The polysilicon layer 18 may be doped to reduce its resistivity.

Figure 3:
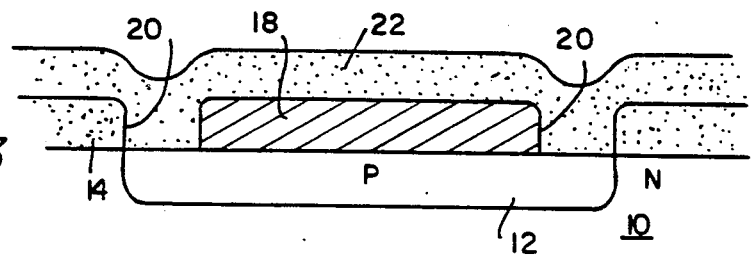
Figure 4:
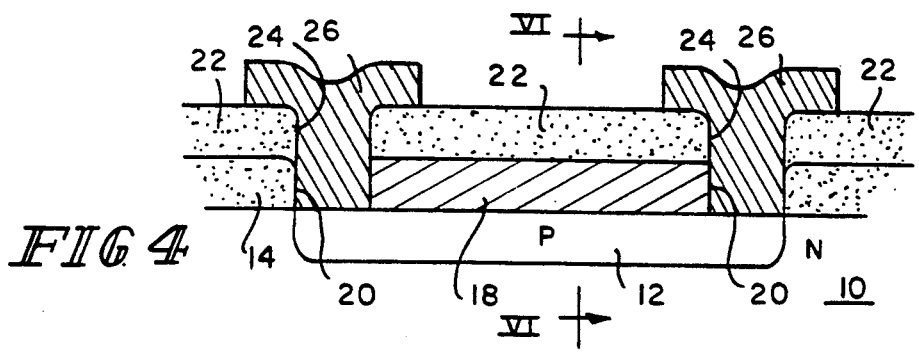

As illustrated in FIG. 3, the conductive layer 18 is then patterned to form initial contact openings or vias 20 therein; and a second insulative layer 22 is formed overall. Contact vias 24 are then formed through the second insulative layer 22 down to the region 12, as illustrated in FIG. 4. Alternately, shield layer 18 need not be patterned before insulative layer 22 is formed; in which case the contact vias 24 and 20 are formed by successively etching through the layers 22 and 18. Conductor contacts 26 are then deposited and delineated in the vias 24.

In the embodiment of FIG. 4, the conductor contacts 26 are in electrical connection with the conductive shield layer 18 as well as the resistive region 12. That is, the region 12 and the layer 18 are electrically in parallel. The conductive shield layer 18 should be of a substantially higher resistance than that of resistive region 12 such that the value of conductive layer 18 does not substantially affect the net resistance of the region 12. Preferably, the sheet resistance of the conductive shield layer 18 is at least one order of magnitude times that of the resistive region 12.

Although the conductive shield 18 is shown covering substantially all of the surface area of the region 12 except where the conductors 26 are provided, this is not essential. However, lesser coverage will reduce the shielding effect.

Figure 5:
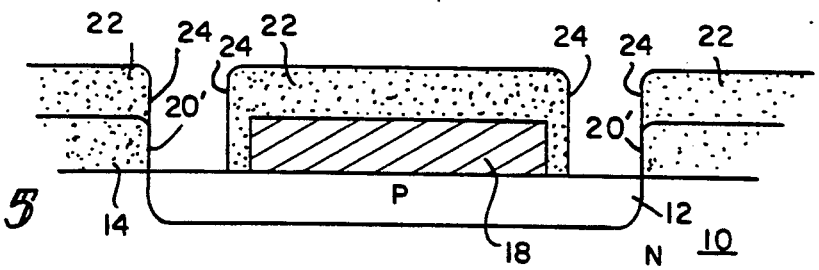
FIG. 5 shows a modification of the process according to the principles of the present invention.

FIG. 5 illustrates a modification of the process to cover less than all of the resistive region while isolating the contacts 26 (not shown) from the conductive layer 18. The vias 20' formed between the first insulative layer 14 and the conductive shield layer 18 are larger than the vias 20 shown in FIG. 3. The subsequent formation of openings 24 through the second insulative layer 22 may be the same dimension as FIG. 3; but would be smaller than the first layer via 20'. This isolates the contacts 26 from direct connection with the conductive shield layer 18. When the conductive layer 18 is polysilicon, the lateral sidewalls of the vias 20' may be formed by well known techniques either prior to or subsequent to the forming of insulative layer region 22.

Figure 6:
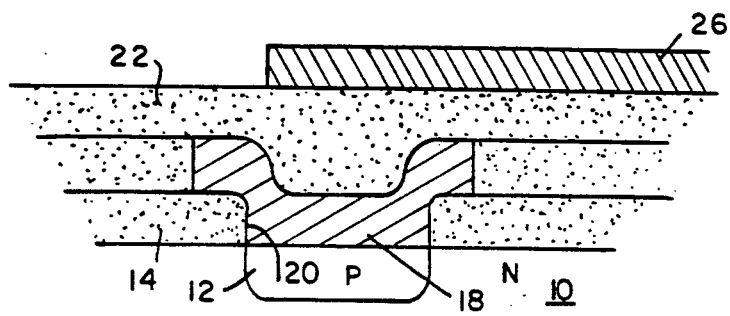
FIG. 6 is a cross-sectional view of the resistor taken along lines VI—VI of FIG. 4.

FIG. 6 illustrates in cross-section the integrated circuit structure of FIG. 4 taken along lines VI—VI. It is noted that the shield layer 18 extends transverse to the resistive region 12 along the semiconductor layer 10. This provides for additional shielding of the silicon and for independent contact to the conductive shield layer 18 if desired.

Figure 7:
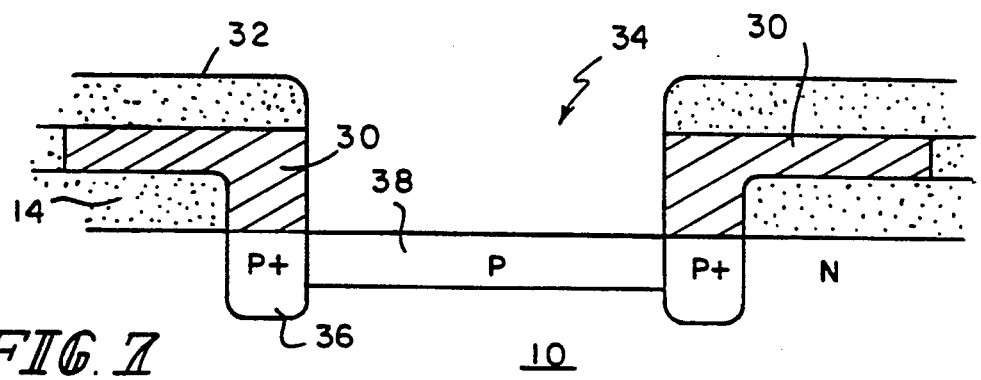
FIGS. 7-9 show in cross-sectional view portions of a process sequence in which a bipolar transistor is formed simultaneously with a resistive region.
Figure 8:
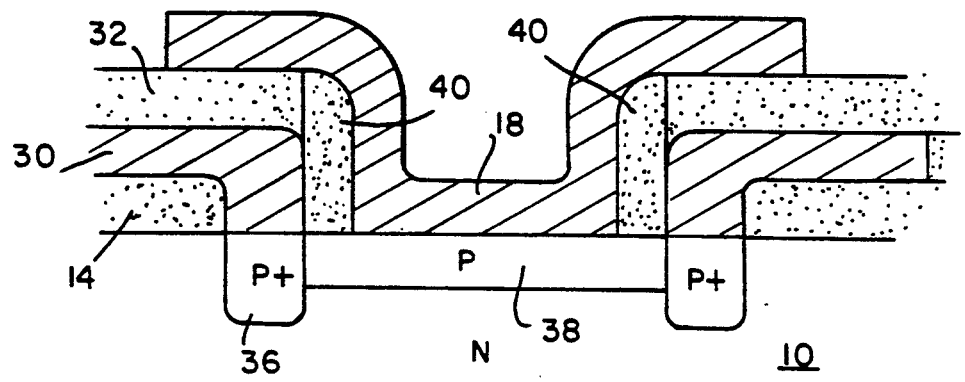
Figure 9:
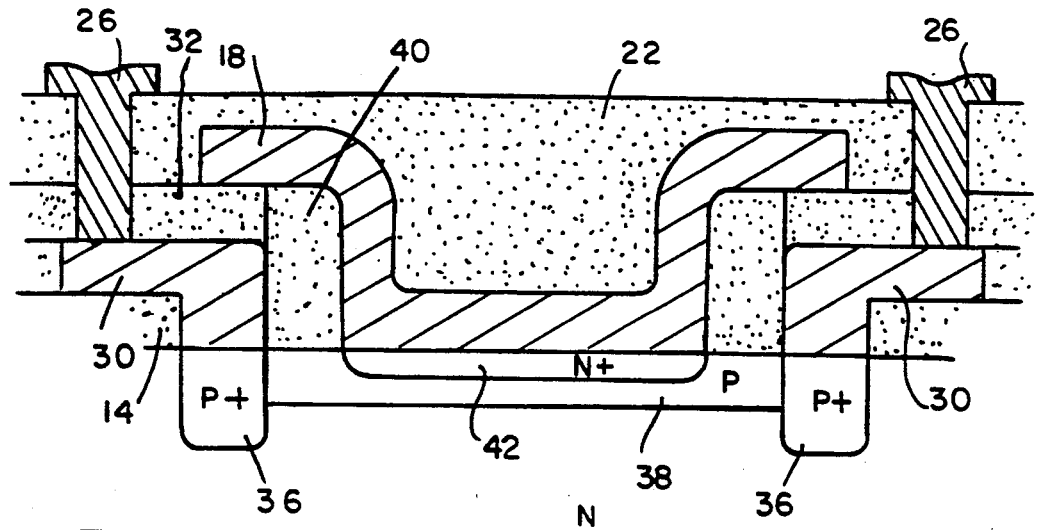

The shielded resistor of FIGS. 1-4 may be formed during a bipolar fabrication process wherein the transistors have polysilicon emitters. FIGS. 7-9 correspond to select process steps during fabrication of transistors, which steps may be performed in parallel with the process steps of FIGS. 1-3. Although this is a double level polysilicon process, a single level polysilicon process may incorporate the invention. As illustrated in FIG. 7, an opening is formed in the first insulative layer 14 and a first layer 30 of P-doped polysilicon is deposited. A second insulative layer 32 is next deposited and patterned to form opening 34 which defines the intrinsic base. P-type impurities are introduced to form the intrinsic base 38 simultaneously with formation of the P-type resistive region 12 of FIG. 1. During the formation of the intrinsic base 38, P-type impurities outdiffuse from the first polysilicon layer 30 to form an extrinsic P+ base region 36. Alternately, the P+ region 36 may incorporate a masking step and not be outdiffused from the contact layer 30. The polysilicon layer 30 may form an annular extrinsic base contact, or may be formed as two separate regions to provide two separate resistor contacts.

Insulative spacers 40 are formed on the sidewall portion of the opening 34 along the exposed polysilicon of layer 30 and along the second insulative layer 32. See FIG. 8. The spacers 40 may be oxide, nitride, or a combination of these. Next the polysilicon layer 18 is deposited, as described with reference to FIG. 2, to form an emitter contact region. That is, the portion of the layer 18 that contacts the intrinsic base 38 is selectively doped with N-type impurities which are subsequently outdiffused to form the emitter 42 as illustrated in FIG. 9. However, the portion of the polysilicon layer 18 contacting the resistor 12 may be undoped. The polysilicon layer 18 of FIG. 9 is patterned to form the emitter contact. The second insulative layer 22 is then applied as described with reference to FIG. 3. The contacts 26 to the extrinsic base are formed as described with reference to FIG. 4. The emitter and base portions of the final bipolar transistor structure are illustrated in FIG. 9.

Using the double polysilicon process of FIGS. 7-9, a first alternate embodiment resistor structure can be formed with the contacts 26 to the resistive layer 12 connected by an interposed, highly doped polysilicon region. With the intrinsic base region 38 corresponding to the resistive region 12, the separate P+ regions 36 would provide two resistor contact regions. The first polysilicon layer base contacts 30 of the first polysilicon would provide connection to these resistor contacts 36, and the second polysilicon emitter contact 18 would correspond to the shield layer 18. Preferably, the shield layer 18 would be undoped, and therefore the resistor would not have a region equivalent to emitter 42. The resulting structure would correspond to that of FIG. 9 without a region 42; and with the shield layer 18 separated from the resistor contacts 30 and conductors 26 by insulative layers 40, 22, and 32. Alternately, the shield layer 18 may be doped the same conductivity type as the resistive region 12.

Figure 10:
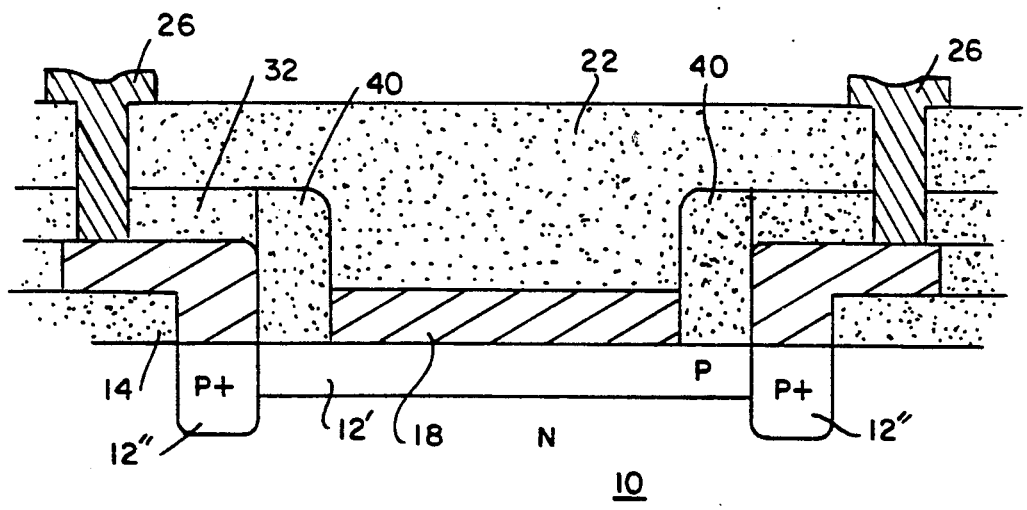
FIG. 10 illustrates in cross-sectional view an alternate embodiment of the shielded resistor, according to the present invention.

A resistor structure equivalent to that of FIG. 9 may be modified such that the second polysilicon layer 18 does not extend above the first polysilicon layer 30. As illustrated in FIG. 10, the resistive region 12' is equivalent to the intrinsic base 38 of the bipolar transistor of FIG. 9 and resistor contact regions 12" are equivalent to the extrinsic base portions 36. This allows the contacts 26 to be made closer together and directly above the contact regions 12" if desired. This reduces the surface area required for conductors and interconnects and improves planarity of the insulative layer 22.

A double polysilicon process may also be used wherein the first polysilicon layer 30 provides the shield, and the second polysilicon layer 18 provides the resistor contacts. See FIG. 11. The spacers 40 separate the first polysilicon shield 30 and the second level polysilicon resistor contact regions 18. The conductors 26 make contact with the resistor region 12 through the second polysilicon layer 18. Thus, at least the second polysilicon layer 18 must be doped with impurities to reduce its resistance, whereas the first polysilicon layer 30 forming the shield may or may not be doped with impurities. Since the resistor in FIG. 11 includes both polysilicon layers, the resistive region 12 would be formed using the collector formation processing steps and a double polysilicon process or using collector contacts which are formed between the surface and the buried collector region. This would be formed through an opening in insulative layer 14 prior to any of the polysilicon processing steps.

Figure 11:
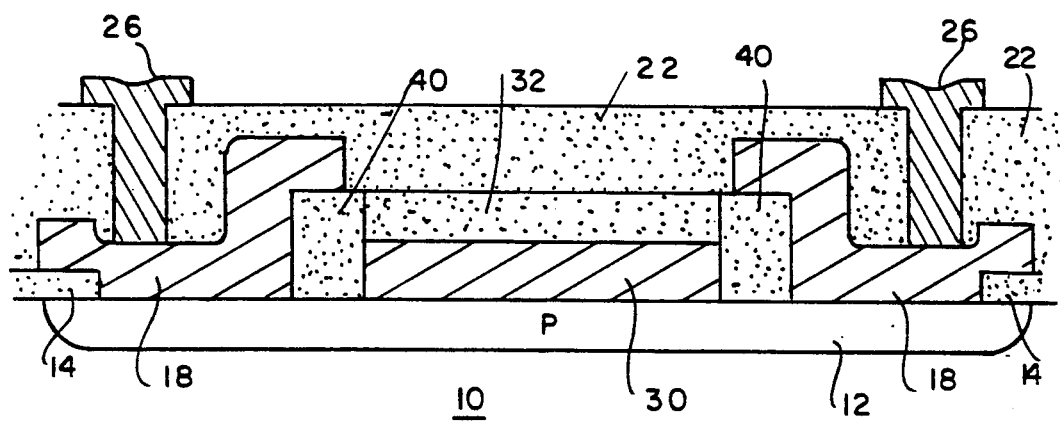
FIG. 11 illustrates in cross-sectional view another alternate embodiment of the shielded resistor according to the present invention.
Figure 12:
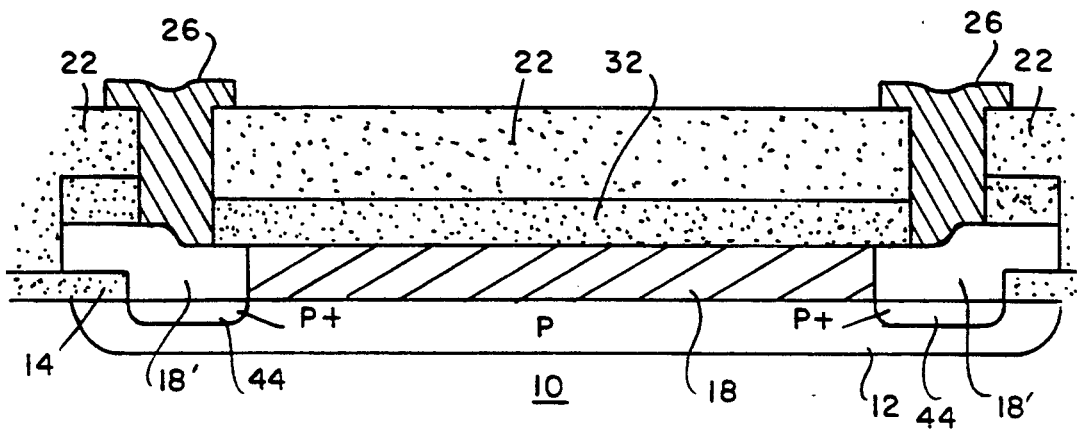
FIG. 12 is a cross-sectional view of still another embodiment of a resistor according to the invention.

FIGS. 10 and 11 show the contact structure to the resistor isolated from the shield region as in FIG. 5. An alternative is to form the resistor with a single polysilicon layer, which has the resistor contacts connected to the shield region as in FIG. 4. This is illustrated specifically in FIG. 12. Assuming that the shield region 18 is the second polysilicon layer 18, resistor region 12 may be formed with the intrinsic base. The second polysilicon layer 18 is selectively doped at the contact regions 18' with P-type impurities to match the P resistor region. During the subsequent heating step, resistor contact regions 44 form equivalent to the emitter 42. The conductors 26 are then connected to the contact regions 18' of the second polysilicon layer. This is a simplified process which increases the amount of surface area of the resistor region 12 in contact with a shield region 18. It should also be noted that the shield region 18 and contact regions 18' may also be formed of the first polysilicon layer 30 by a selective doping process.

As a further variation to FIG. 4, the aperture 24 in the insulative layer 22 may be larger than the aperture 20 in insulative layer 14. This will cause the conductors 26 to contact the side as well portions of the top of the shield 18

Because of the conductive nature of the shield region 18, any induced charges or depletion layer or inversion layer are located in the shield region and therefore do not affect the resistor itself. Also the trapped charges or depletion layer or inversion layer produced by the subsequent formation of the dielectric or insulative layer 22 are shielded from the resistor 12 by the conductive shield layer 18. The shield layer 18 also reduces electronic noise. Thus the present structure improves the resistor's stability and reliability, and controls overall absolute resistance thereby improving device matching.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. An integrated circuit including a resistor comprising:
   a semiconductor resistor region over an integrated circuit;
   a conductive shield layer in contact with and over a substantial portion of said resistor region; and
   an insulator over said shield layer.

2. An integrated circuit according to claim 1 including resistor contacts extending through openings in said insulator and spaced from said conductive shield layer.

3. An integrated circuit according to claim 1 including resistor contacts extending through openings in said insulator and contacting said conductive shield layer.

4. An integrated circuit according to claim 1 wherein said conductive shield layer has a higher resistance than said resistor region.

5. An integrated circuit according to claim 4 wherein said conductive shield layer has a resistance at least one order of magnitude higher than said resistor region.

6. An integrated circuit according to claim 1 wherein said conductive shield layer is a metallic material.

7. An integrated circuit according to claim 1 wherein said conductive shield layer is a polycrystalline semiconductor material.

8. An integrated circuit according to claim 1 wherein said resistor region is a doped region in a monocrystalline semiconductor layer.

9. An integrated circuit according to claim 1 including a bipolar transistor having a base region similar to the resistor region, an emitter region and an emitter contact which is similar to the conductive shield layer.

10. An integrated circuit according to claim 9 wherein said conductive shield layer and said emitter contact are of a common polysilicon semiconductor material.

11. An integrated circuit including a resistor comprising:
    a doped resistor region in a monocrystalline semiconductor layer of an integrated circuit;
    a polycrystalline semiconductor shield layer in contact with and over a substantial portion of said resistor region;
    a pair of polycrystalline semiconductor contacts on said resistor region and adjacent opposed sides of said shield layer;
    an insulator over said shield layer and said contacts;
    a pair of conductors extending through openings in said insulator to said contacts.

12. An integrated circuit according to claim 11, including an insulator between said shield layer and said contacts.

13. An integrated circuit according to claim 11, wherein said shield and said contacts are a common continuous layer.

14. An integrated circuit according to claim 13, wherein said shield portion of said common layer is undoped and said contact portion of said common layer is doped with the same conductivity type impurities as said resistor region.

* * * * *

UNITED STATES PATENT AND TRADEMARK OFFICE
CERTIFICATE OF CORRECTION

PATENT NO. : 5,200,733

DATED : April 6, 1993

INVENTOR(S) : Christopher K. Davis, Thomas L. Carndell

It is certified that error appears in the above-identified patent and that said Letters Patent is hereby corrected as shown below:

On the title page, should read:

Assignee:  Harris Corporation

Signed and Sealed this

Second Day of August, 1994

Attest:

BRUCE LEHMAN

Attesting Officer                Commissioner of Patents and Trademarks

UNITED STATES PATENT AND TRADEMARK OFFICE
CERTIFICATE OF CORRECTION

PATENT NO. : 5,200,733

DATED : April 6, 1993

INVENTOR(S) : Christopher K. Davis, Thomas L. Carndell

It is certified that error appears in the above-identified patent and that said Letters Patent is hereby corrected as shown below:

On the title page, Item ]75]:
Inventor: Thomas L. Crandell

Signed and Sealed this

Sixth Day of September, 1994

Attest:

BRUCE LEHMAN

Attesting Officer

Commissioner of Patents and Trademarks